United States Patent [19]
Fukuda et al.

[11] Patent Number: 5,347,100
[45] Date of Patent: Sep. 13, 1994

[54] SEMICONDUCTOR DEVICE, PROCESS FOR THE PRODUCTION THEREOF AND APPARATUS FOR MICROWAVE PLASMA TREATMENT

[75] Inventors: Takuya Fukuda; Michio Ohue, both of Hitachi; Fumiyuki Kanai, Hoya; Atsuyoshi Koike, Kokubunji; Katsuaki Saito; Kazuo Suzuki, both of Hitachi, all of Japan

[73] Assignees: Hitachi, Ltd., Tokyo; Hitachi Engineering & Services, Inc., Hitachi, both of Japan

[21] Appl. No.: 857,658

[22] Filed: Mar. 26, 1992

[30] Foreign Application Priority Data

Mar. 29, 1991 [JP] Japan .................. 3-089425
Sep. 17, 1991 [JP] Japan .................. 3-235930

[51] Int. Cl.⁵ .................. B23K 9/00; B44C 1/22
[52] U.S. Cl. .................. 219/121.43; 219/121.44; 437/228; 437/235; 437/245; 204/298.35; 156/646
[58] Field of Search .................. 219/121.43, 121.44; 156/646, 645; 437/238, 48, 52, 235, 228, 186, 187, 41; 204/298.37, 298.36, 298.17

[56] References Cited

U.S. PATENT DOCUMENTS

| | | | |
|---|---|---|---|
| 4,859,618 | 8/1989 | Shikata et al. | 437/41 |
| 5,069,747 | 12/1991 | Cathey et al. | 156/643 |
| 5,126,290 | 6/1992 | Lowrey et al. | 437/235 |
| 5,173,448 | 12/1992 | Yanagi | 437/186 |
| 5,229,325 | 7/1993 | Park et al. | 437/187 |

FOREIGN PATENT DOCUMENTS

60-91645  5/1985  Japan .

OTHER PUBLICATIONS

K. Machida, et al., "SiO₂ Planarization Technology with Biasing and Electron Cyclotron Resonance Plasma Deposition for Submicron Interconnections", J. Vac. Sci. Technol. B4(4), Jul./Aug. 1986, pp. 818–821.

*Primary Examiner*—Mark H. Paschall
*Attorney, Agent, or Firm*—Antonelli, Terry, Stout & Kraus

[57] ABSTRACT

Disclosed are a semiconductor device comprising a semiconductor substrate, a first metal connection layers, a first substrate oxide layer having a specific form, and a second connection pattern layer; a process for producing the device; and a microwave plasma treatment apparatus having gas feed ports in a specific position. The highly reliable semiconductor devices can be produced at a high rate at high yields.

11 Claims, 16 Drawing Sheets

SEMICONDUCTOR DEVICE, PROCESS FOR THE PRODUCTION THEREOF AND APPARATUS FOR MICROWAVE PLASMA TREATMENT

BACKGROUND OF THE INVENTION

The present invention relates to a semiconductor device, a process of the production thereof and a microwave plasma treatment apparatus for use in the process. More specifically, it relates to a highly reliable semiconductor device for use in LSIs, a process for producing the semiconductor device at high yields, and a microwave plasma treatment apparatus suitable for forming a high-quality thin film on a substrate having a large area uniformly at a high rate or for carrying out an etching treatment uniformly at a high rate.

In a conventional semiconductor device, an insulating layer between connection pattern layers is a flat insulating layer which is formed by a chemical vapor deposition method (to be referred to as "CVD method" hereinafter) combined with sputtering as described in "SiO2 planarization technology with biasing and electron cyclotron resonance plasma deposition for submicron interconnections" (J. Vac. Sci Technol, B4 pp. 818 (1986)) and JP-A-60-91645 or by a method in which an SiO2 film is formed by a CVD method and then an SiO2 is formed by a coating method as described in "Interlayered Dielectric Planarization with TEOS-CVD and SOG" (Proc. V-MIC, p. 419 (1988)).

The arrangement in the above prior art disclosure have the following defects.

(1) In the CVD combined in sputtering arrangement when a sputter amount is large, an insulating material can be filled between pattern lines of an electrically conductive material forming a lower connection pattern layer without regard to connection pattern line intervals. However, where the line width is small, the insulating layer on the pattern is flattened and has a small thickness, and where the line width is large, the insulating layer on the pattern remains unflattened in some places and has a large thickness (see FIG. 2). Therefore, there arises a problem that an uneven etching occurs at an etching step for making through holes. Further, a portion of which the insulating layer has a thin thickness has high electric capacity and causes a wiring delay.

(2) A film obtained by superimposed sputtering has a high compressive stress and therefore exerts a large stress on an electrically conductive material coated therewith. As a result, there arises a problem that the resultant semiconductor device is unreliable or that the film peels off.

(3) When the sputter amount is small or when there is employed a method in which an oxide film is formed by a CVD process which is not combined no sputtering and the height difference is reduced with a coating such as a spin on glass film (to be referred to as "SOG film"), an insulating material is sufficiently filled between pattern lines only if the pattern line distance is large and if the aspect ratio is small. When the aspect ratio between the pattern lines exceeds 1, due to a first layer of a CVD film deposited by a CVD method, a portion to be filled with a second layer of an SOG film is very steep and has a larger aspect ratio, and an opening portion is also extraordinarily narrowed. As a result, there arises a problem that, even if an SOG film material having high fluidity is used, a void is liable to occur where the distance between pattern lines is small (see FIG. 3) to greatly reduce the reliability of the resultant semiconductor device.

(4) The similar problem to that discussed in the above (3) also occurs not only in an insulating film between pattern layers but also in a portion where an outermost organic protection film having a steep height difference portion is formed. That is, a protection film is conventionally formed by a CVD process which is not combined no with sputtering. However, this method has a problem in that an organic packaging material cannot be filled between outermost connection pattern lines, which reduces the reliability.

As a microwave plasma treatment apparatus, an apparatus as described in JP-A-63-217620 is known.

FIG. 34 shows a schematic view showing the cross section of the above conventional microwave plasma treatment apparatus.

In FIG. 34, numeral 301 indicates a substrate formed of silicon, Si, etc., numeral 302 indicates a substrate holder, numerals 303 and 304 indicate reaction gas feed lines, numeral 305 indicates a gas outlet, numeral 306 indicates a microwave inlet, numeral 307 indicates a microwave-introducing aperture, 309 indicates a vacuum chamber, 310 indicates a microwave guide tube, 311 indicates a magnetic field supply coil, and numerals 312 and 313 indicate gas feed ports.

The substrate 301 is placed on the substrate holder 302, and the substrate holder 302 is arranged within the vacuum chamber 309. A gas fed by one reaction gas feed line 303, e.g., oxygen, O2, is blown out into the vacuum chamber 309 from one gas feed port 312 through an annular gas-introducing path (not shown). On the other hand, a gas fed by the other gas feed line 304, e.g., monosilane, SiH4, is similarly blown into the vacuum chamber 309 from the other gas feed port 313 through an annular gas-introducing path (not shown). Microwave supplied by the microwave inlet 306 is introduced into the vacuum chamber 309 through the microwave guide tube 310 and the microwave-introducing aperture, and a magnetic field generated by the magnetic field supply coil 311 is supplied into the vacuum chamber 309. Further, gases formed after the reaction or unreacted gases are discharged out of the vacuum chamber 309 through the gas outlet 305.

In the above case, the gas feed port 312 which is one of the two gas feed ports is positioned considerably far from the above substrate 301, and the other gas feed port 313 is positioned in the vicinity of the substrate 301. Further, these gas feed ports have a constitution in which each has an aperture formed in parallel with the substrate 301 and gases are blown out from the gas feed ports 312 and 313 nearly in parallel with the substrate 301.

In the above-described conventional microwave plasma treatment apparatus, nothing has been taken into consideration concerning the relationship between the reaction process of a plurality of gases blown into the vacuum chamber 309 and the distances from the gas feed ports 312 and 313 to the substrate 301. Due to this, a plurality of the above gases sometimes react before these gases reach the substrate 301, and there arises a problem that in some cases no high-quality thin film is formed, or in some cases a high-performance etching treatment is not conducted uniformly. In particular, with an increase in that surface area of the substrate which is to be treated, the probability of occurrence of the above problem increases.

In addition to the above, the conventional microwave plasma treatment apparatus also has problem in that it has a useless space contributing to no reaction due to a considerably large length in the central axis direction.

SUMMARY OF THE INVENTION

It is an object of a first aspect of the present invention to overcome the above disadvantage (1), (2), (3) and (4), and provide a semiconductor device having a substantially uniform insulating layer between connection patterns and a process for the production thereof.

(5) Further, in a second aspect of the present invention, it is an object of the present invention to provide a microwave plasma treatment apparatus with which a high-quality thin film can be formed at a high rate and high-performance etching treatment can be carried out at a high rate and which also permits decreasing of the length in the central axis direction.

The above objects (1) and (3) are achieved by the use an insulating film which is formed by filling an interlayer insulating material between first metal connection layers so that the filled material has a greater thickness than the first metal connection layers and that the thicknesses of portions formed on the first metal connection layers are equalized, and which has grooves each having a greater width than the corresponding groove of the first metal connection layer.

The above object (2) is achieved by forming an SOG film using a material having excellent fluidity and containing an organic solvent on the above insulating film as a first layer, by forming a CVD film from an organic silane material or by forming a CVD film using a material having a reflowability.

The above object (4) is achieved in the same manner as in achieving the objects (1) and (3), i.e., by means of an insulating film which is formed by filling an insulating material between the outermost connection pattern so that the filled insulating material has a greater thickness than the pattern lines, and which has grooves each having a greater width than the corresponding groove of the outermost connection pattern.

The above object (5) is achieved by a microwave plasma treatment apparatus being provided with a vacuum chamber where at least two gases react, gas feed ports to feed the above gases into the vacuum chamber and a means of supplying microwave in the central axis direction of the vacuum chamber through an introduction aperture and holding a substrate, the gas feed ports being positioned between the introduction aperture and the substrate, the apparatus employing means of positioning all of the gas feed ports within a minimum average free path distance of the molecules of the gases to the substrate.

The above object (5) is also achieved by a microwave plasma treatment apparatus being provided with a vacuum chamber where at least two gases react, gas feed ports to feed the above gases and a means of supplying microwave in the central axis direction of the vacuum chamber through an introduction aperture and holding a substrate, the gas feed ports being positioned between the introduction aperture and the substrate, the apparatus employing another means of positioning all the gas feed ports within a minimum average free path distance of the molecules of the gases to the substrate and positioning each of the gas feed ports on a plane in parallel with the substrate.

The above distance of minimum average free path refers to a distance in which at least two gases move without undergoing any reaction. For example, when the pressure in the vacuum chamber is 0.1 Pa, the minimum average free path distance of oxygen molecules, $O_2$, is 300 mm, and that of monosilane $SiH_4$ gas molecules is 100 mm.

Numerals and 23 indicate electrically conductive materials, 3, 3' and 3" indicate insulating films as a first layer in a composite insulating film or SiN protection films. Numerals 4 and 4' indicate insulating films as a second layer in a composite insulating film. Numeral 24 indicates a through hole. Numerals 28, 29 and 32 indicate multilayered A1 connection pattern lines. Numeral 28 and 31 indicate A1 interlayer insulating films. Numeral 33 indicates an SiN protection film. Numeral 34 indicates an insulating film as a third layer in a composite insulating film.

Figure 22:
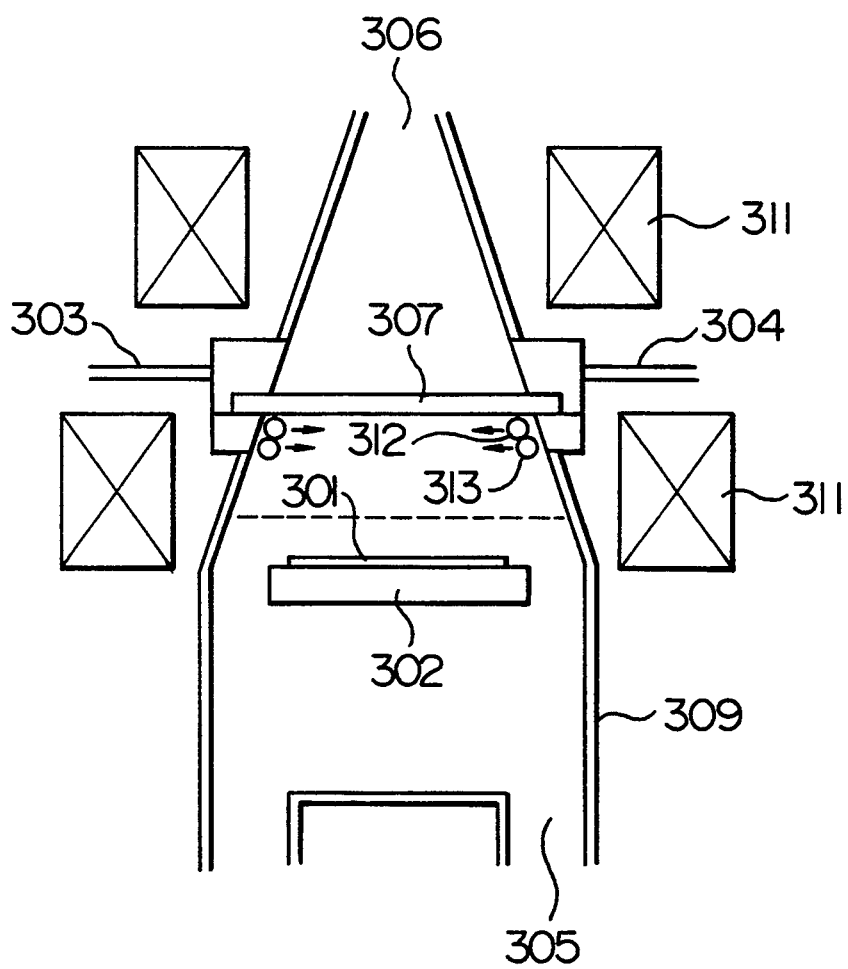

FIG. 22 is a schematic view of a first embodiment of the microwave plasma treatment apparatus of the present invention.

Figure 23:
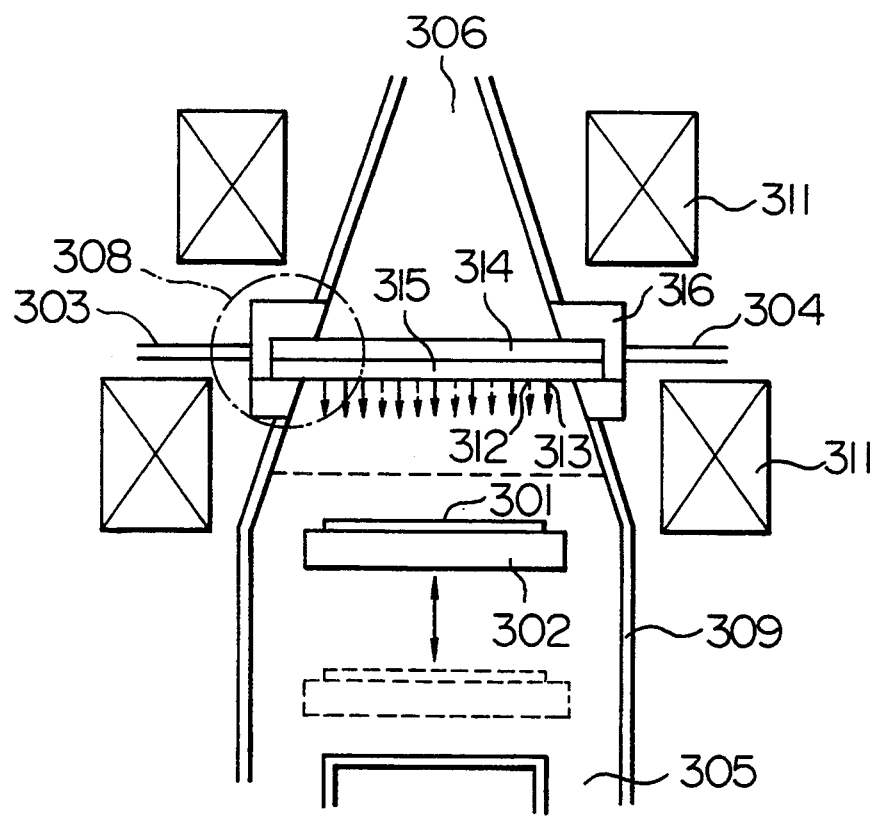

FIG. 23 is a schematic view of a second embodiment of the microwave plasma treatment apparatus of the present invention.

Figure 24:
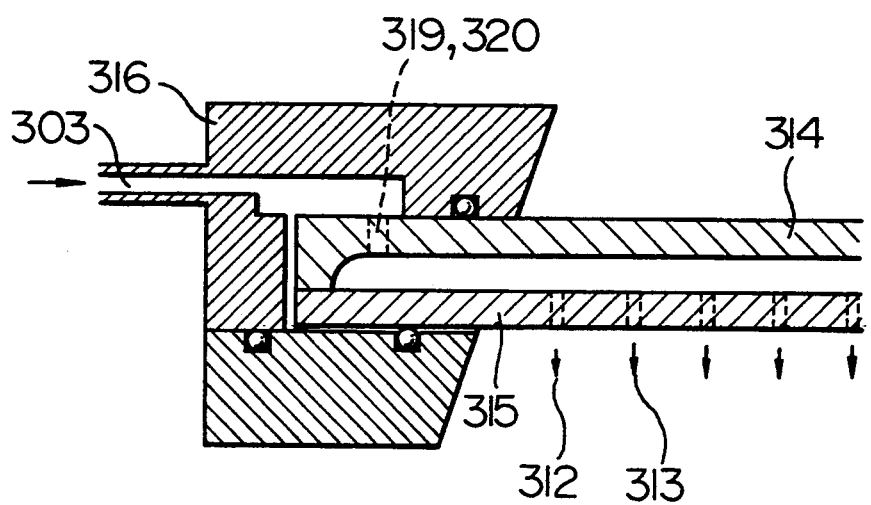

FIG. 24 is a schematic view of the gas feed portion of the second embodiment.

Figure 25A:
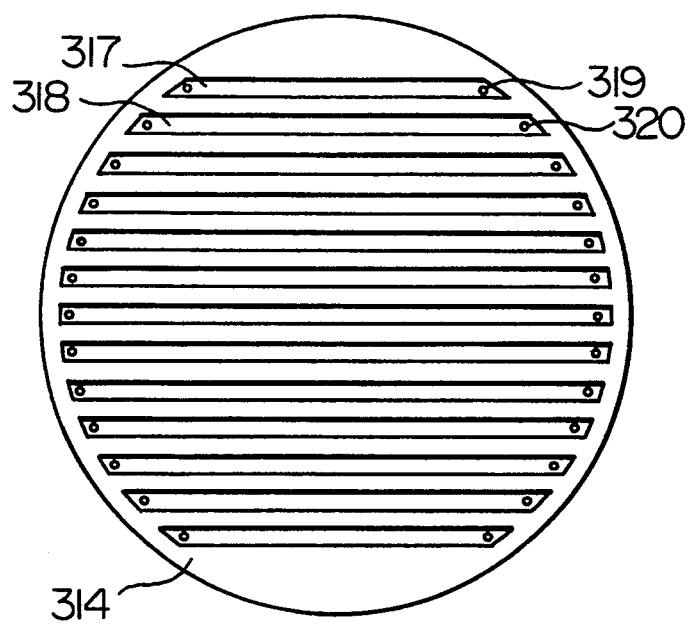
Figure 25B:
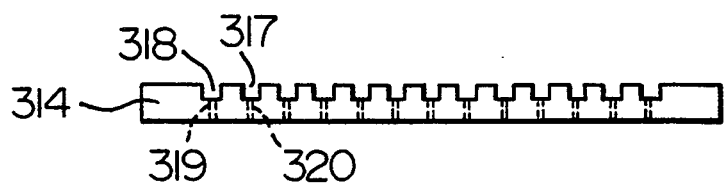

FIG. 25 shows a bottom view of an upper quartz plate used in the present invention and a cross sectional view thereof.

Figure 26:
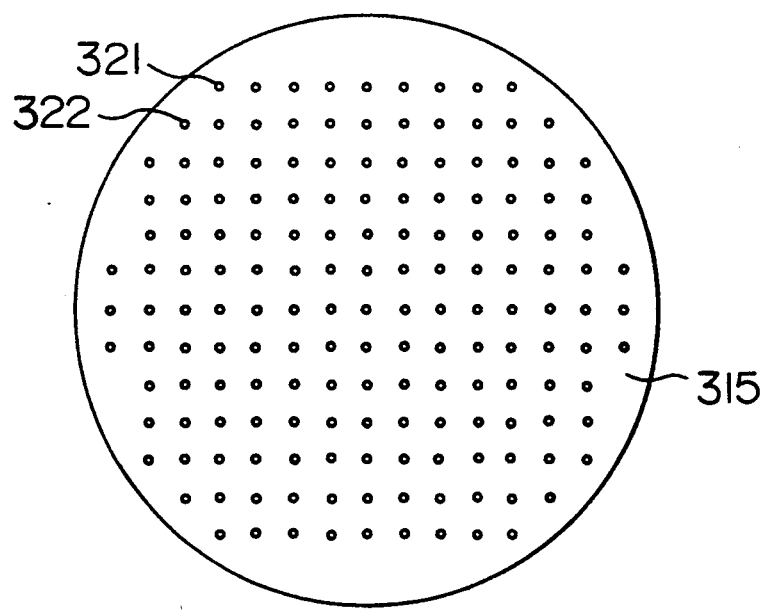

FIG. 26 shows a top view of a lower quartz plate used in the present invention.

Figure 27:
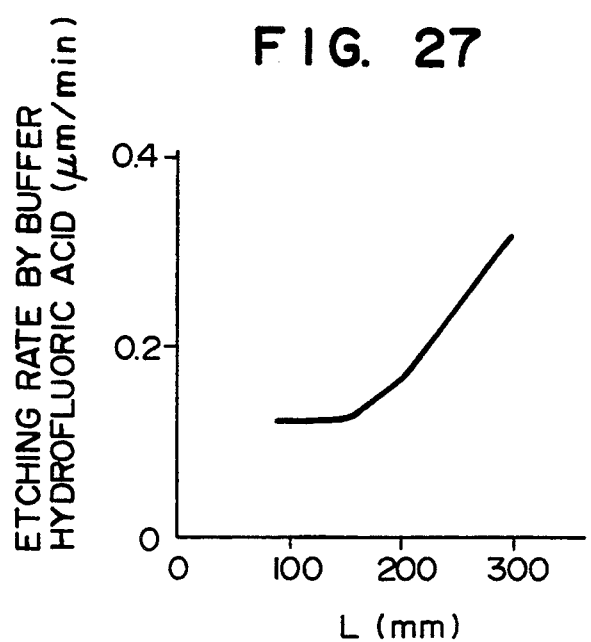

FIG. 27 is a graph showing the relationship between the distance, L, from a substrate to a gas feed port and an etching rate.

Figure 28:
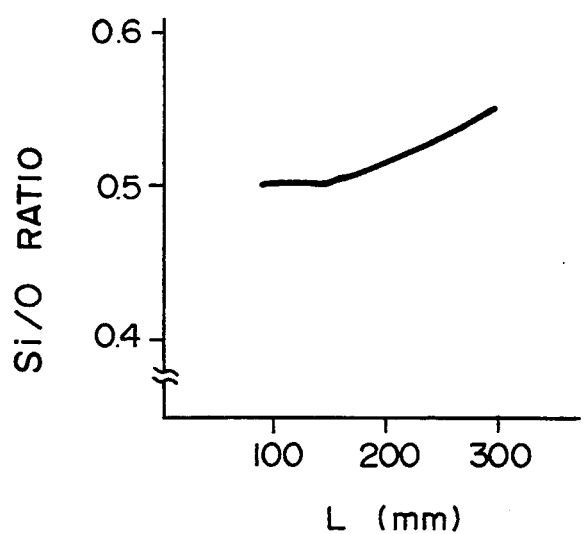

FIG. 28 is a graph showing the relationship between the distance, L, from a substrate to a gas feed port and an elemental composition ratio.

Figure 29:
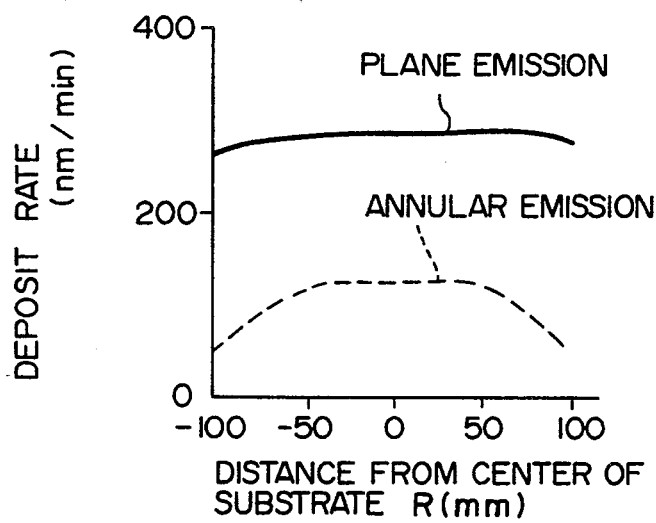

FIG. 29 is a graph showing the relationship between a distance, R, from the center of a substrate and a deposition rate.

Figure 30:
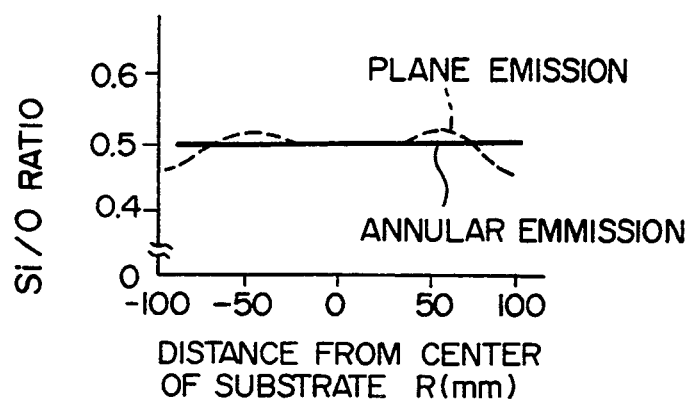

FIG. 30 is a graph showing the relationship between a distance, R, from the center of a substrate and an elemental composition ratio.

Figure 31:
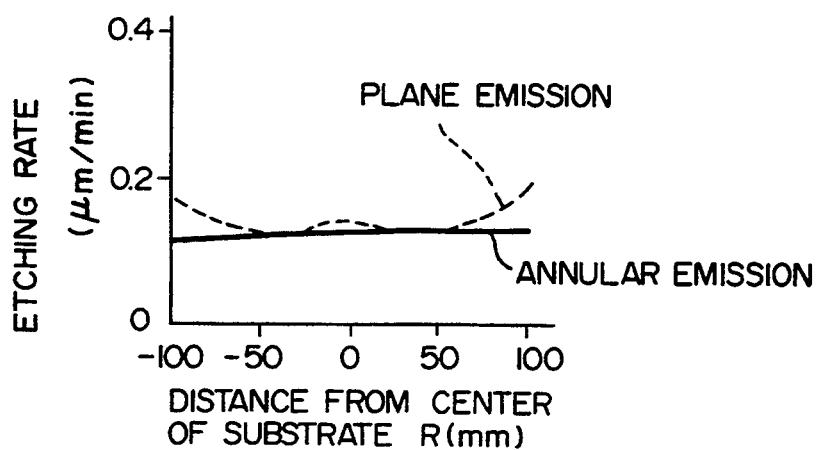

FIG. 31 is a graph showing the relationship between a distance, R, and an etching rate.

Figure 32:
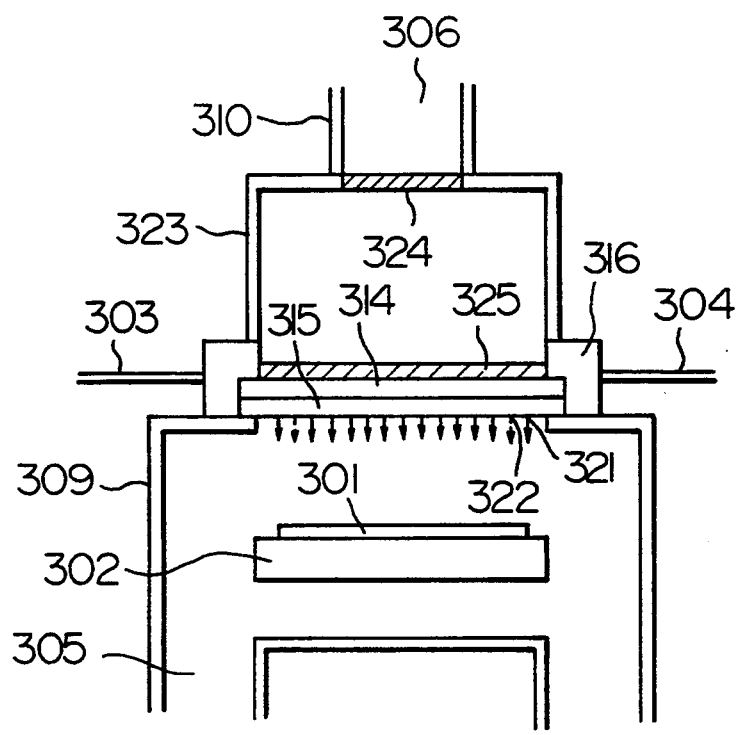

FIG. 32 is a schematic view of a third embodiment of the microwave plasma treatment apparatus of the present invention.

FIG. 33 shows a bottom view of an upper quartz plate used in the present invention and a cross-sectional view thereof.

Figure 34:
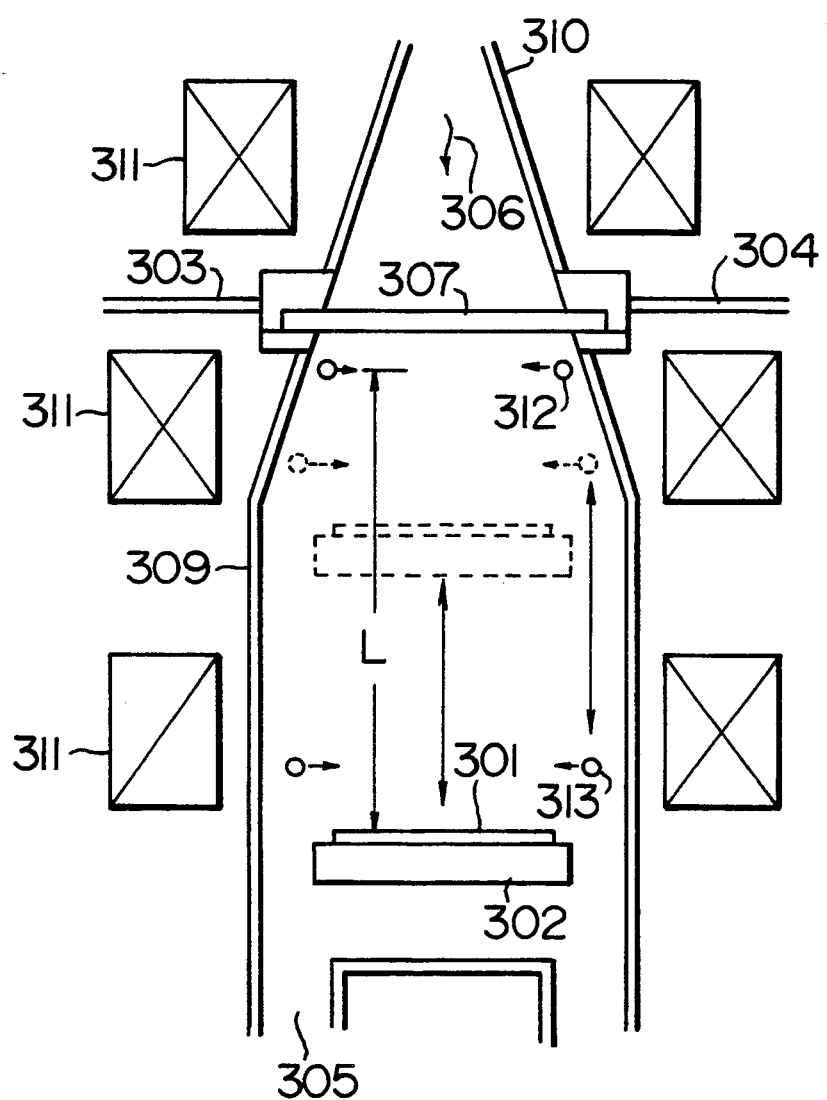

FIG. 34 is a schematic view of a conventional microwave plasma treatment apparatus.

In the above Figures, numerals indicate the following:
301: substrate
302: substrate holder
303, 304: reaction gas feed line
305: gas outlet
306: microwave supply port
307, 325: microwave introduction aperture
308: gas feed portion
309: vacuum chamber
310: microwave guide tube
311: magnetic field supply coil
312, 313: gas feed port
314: upper quartz plate
315: lower quartz plate
316: ring made of aluminum
317, 318: a plurality of grooves
319, 320: hole
321, 322: gas blowing port
323: microwave resonance portion
324: quartz aperture

DETAILED DESCRIPTION OF THE INVENTION

First, the first aspect of the present invention will be described hereinafter.

Figure 1:
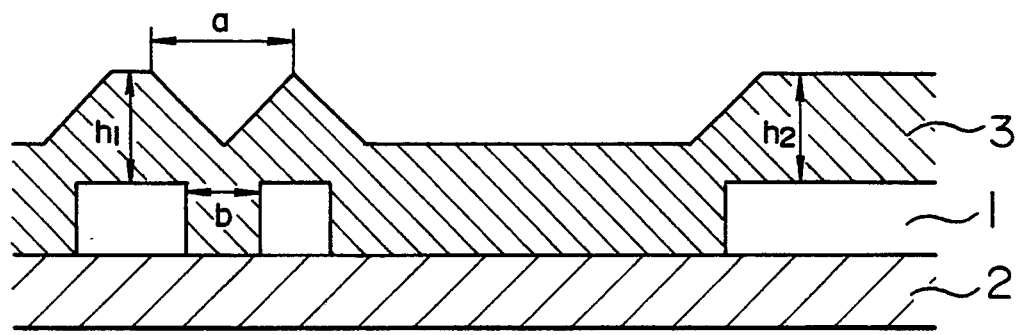
FIG. 1 is a cross-sectional view of one embodiment of the semiconductor device of the present invention.

An insulating film is formed as follows. As shown in FIG. 1, an insulating material is filled between lines of a first metal connection pattern such that the insulating material has a greater thickness than the pattern, that the heights of the convex portions formed correspondingly to the first pattern are equalized and that the width of the groove between the above convex portions is greater than that of the groove of the first pattern, whereby a first layer for an insulating film is formed. Then, a second layer is formed thereon from an insulating material having high flowability. In this case, a material to form the second layer can be easily filled in the groove between the convex portions of the first layer, and the layer is formed in such a form that it is retained between the convex portions. For this reason, a flattened film having a uniform thickness can be formed on the first pattern, both where the first pattern line interval is small and where the first pattern line interval is large. Further, since the distance between the convex portions of the first layer is larger than the distance of the convex portions of the first pattern, no void is formed in the flattened film. When a through hole for the connection of a lower electrically conductive material and an upper electrically conductive material is made by etching, no uneven etching occurs due to the above insulating film has a uniform thickness. As a result, the reliability of the semiconductor device is greatly improved. In this case, it is naturally preferable that the insulating film of the second layer has a moderately inclining surface, and the convex portions of the insulating material forming the first layer preferably has a degree of inclination. In a CVD method superimposed with sputtering, a film grows with cutting the edge of the convex portion at 45°. It therefore meets with this purpose to use a CVD method using controlled sputtering when the first layer is formed. It further suits this purpose to moderate the edge of the convex portion by lightly etching the surface of CVD film formed by a CVD method superimposed with sputtering. Further, the use of plasma by means of an electron cyclotron resonance (ECR) has an effect of improving the throughput in the production, since the film-forming rate becomes higher with an increase in the plasma density over conventional RF plasma.

The CVD film formed by a CVD method superimposed with sputtering exerts a compressive stress on the first connection pattern. A coating such as an SOG film containing an organic solvent, a film having flowability such as a CVD film containing an organic silane and a film giving a reflow form have a far lower density than the above film formed by a CVD method superimposed with sputtering, and give the first connection pattern a tensile stress. Therefore, the above film formed by a CVD method superimposed by sputtering is used as a first layer, and a film containing carbon or a film having a lower density is used as a second layer, whereby the stress on the first connection pattern or the substrate constituting a semiconductor device can be decreased, or the peeling of the first layer can be prevented. Due to this means, the above problem (2) can be overcome.

Like the formation of the above first layer of the interlayer insulating film, the final protection film of the semiconductor device is also formed to have a form in which the width of the groove between the convex portions is greater than the width of the groove between the convex portions of the lower pattern, whereby, even if a resin material is formed thereon, a void is hardly formed, and the reliability of the semiconductor device is improved.

Secondly, the second aspect of the present invention will be explained hereinafter.

When plasma treatment is carried out by reacting at least two gases in the microwave plasma treatment apparatus, for example, monosilane, $SiH_4$, and oxygen, $O_2$, are used as gases. And, when a silicon dioxide, $SiO_2$, film is formed on a silicon, Si, substrate from these monosilane, $SiH_4$, and oxygen, $O_2$, by introducing them into the vacuum chamber through one feed port, the silicon dioxide, $SiO_2$, film is very coarse since these gases are highly reactive.

For the above reason, each gas has is provided with its own feed port, and the gases are separately introduced into the vacuum chamber through these feed ports. In an apparatus of this conventional type, however, nothing has been considered concerning the positions of the above gas feed ports relative to the substrate, and each gas feed port has not been positioned within the average free path distance of each of the monosilane, $SiH_4$, and oxygen, $O_2$. Therefore, molecules of these gases collide to form silicon dioxide, $SiO_2$, molecules and a silicon dioxide, $SiO_2$cluster, and these reach the substrate surface and are merely deposited thereon.

According to one means described earlier, all the gas feed ports are positioned within the minimum average free path distance of the gases to the substrate. Therefore, when at least two gases are separately introduced into the vacuum chamber through their corresponding feed ports, these gases reach the substrate surface almost without reacting with each other in the vacuum chamber. Due to this, a high-quality thin film is formed on the substrate and high-performance etching treatment is conducted thereon. Further, this formation or the treatment is carried out at a higher rate than any conventional method.

According to the other means described earlier, all the gas feed ports are positioned within the minimum average free path distance of the gases to the substrate, each of the gas feed ports is arranged on a plane in parallel with the substrate surface, and all these gas feed ports are constituted so as to open in the vertical direction relative to the substrate. Therefore, when at least two gases are separately introduced into the vacuum chamber from the corresponding feed ports, all the gases blown into the vacuum chamber reach the substrate surface almost without reacting with each other. Due to this, a high-quality thin film is uniformly formed on the substrate and high-performance etching treatment is uniformly conducted thereon. Further, this formation or the treatment is carried out at a higher rate than any conventional method.

DESCRIPTION OF PREFERRED EMBODIMENTS

The first aspect of the present invention will be described hereinafter by reference to drawings.

Figure 2:
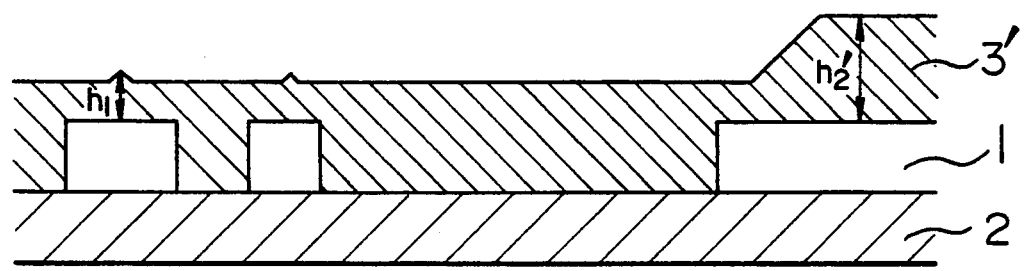
FIG. 2 is a cross-sectional view of an interlayer insulating film formed by a conventional CVD combined sputtering.
Figure 3:
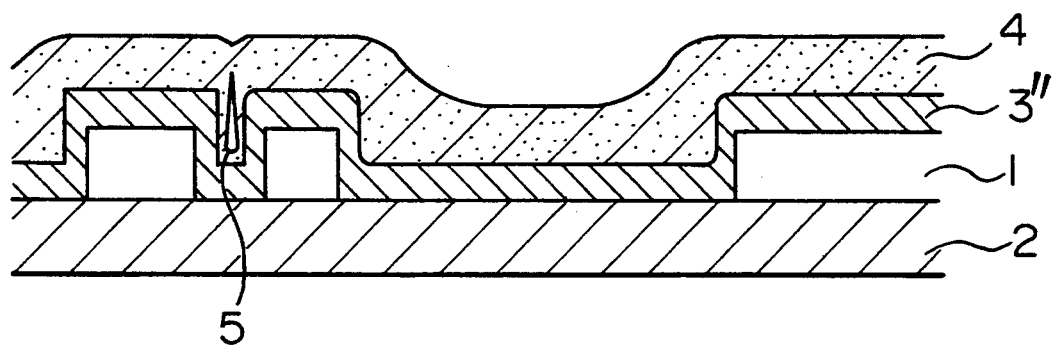
FIG. 3 is a cross-sectional view of a composite interlayer film formed by CVD not combined with sputtering and an SOG film forming method.

FIG. 1 shows the insulating film structure of the first embodiment of the present invention. This structure is formed as follows. A silicon oxide, $SiO_2$, film 2 is deposited on a silicon substrate having a diameter of about 100 mm by a hot CVD method so as to have a thickness of 400 nm, and then an Al material is deposited thereon by a sputtering method so as to have a thickness of 500 nm. An Al pattern 1 is formed from an Al material through a mask formed of a patterned resist material by a reactive ion etching method, the Al pattern being a first connection pattern having a minimum width of 0.4 $\mu$m, a minimum pattern interval of 0.4 $\mu$m and a total length of 5 mm. Thereafter, the mask is removed by ashing, and the resultant product is used as a substrate. Then, a first silicon oxide layer 3 is deposited by a CVD apparatus which can be superimposed with sputtering. FIGS. 2 and 3 show cross-sectional forms of other interlayer insulating films as comparative embodiments. FIG. 2 shows the cross-sectional form of an interlayer insulating film formed when the sputter amount is large. FIG. 3 shows the cross-sectional form of an interlayer insulating film obtained by forming an $SiO_2$ film by a CVD method which is not combined with sputtering and forming an SOG film as a second layer.

Figure 4:
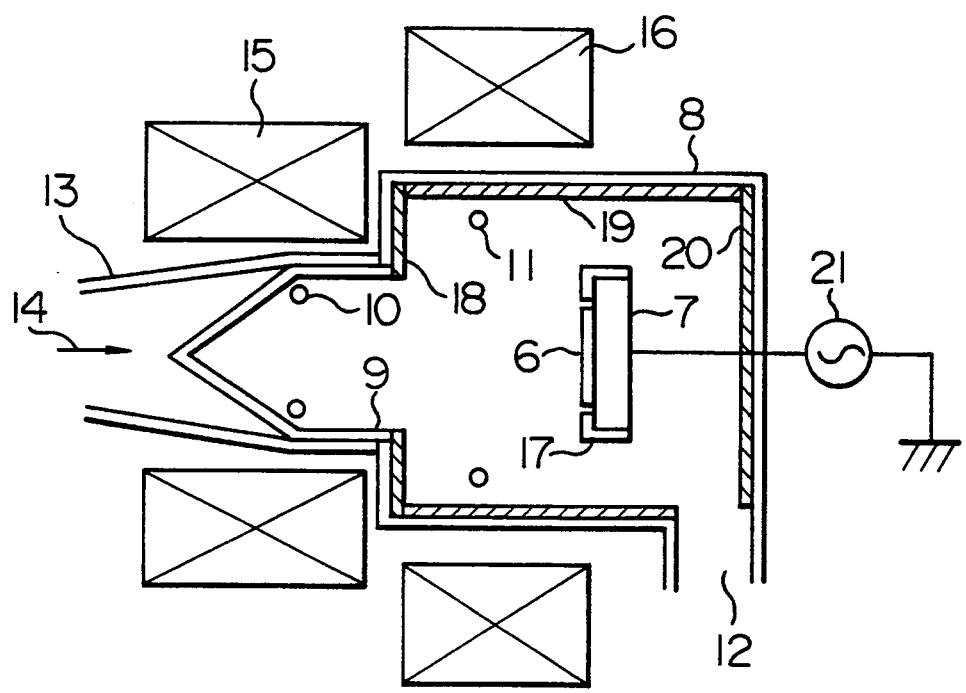
FIG. 4 shows one embodiment of a CVD apparatus which permits controlling of the sputter amount.

FIG. 4 shows a CVD apparatus used for forming the structure of the embodiment of the present invention.

The apparatus of this embodiment has a substrate holder 7 to transmit a high-frequency wave to a substrate 6, a high-frequency source 21, a microwave guide tube 13 (an oscillator to generate microwave 14 not shown), a discharge tube 9 of which the top forms a microwave-introducing aperture, a plasma treatment chamber 8 which is a vacuum chamber made of Al, magnetic field coils 15 and 16 which cause an electron cyclotron resonance, reaction gas feed nozzles 10 and 11, an exhaust gas outlet 12, and quartz walls 17, 18, 19 and 20 which insulate the treatment chamber and the holder. The $SiO_2$ was formed as follows. Oxygen was introduced from the gas nozzle 10 at a rate of 200 ml/minute, monosilane, $SiH_4$, was introduced from the gas nozzle 11 at a rate of 20 ml/minute, and the pressure within the treatment chamber 19 was adjusted to 0.3 Pa by adjusting the exhaust gas amount. A magnetic flux density of 875 Gauss was applied to the treatment chamber with the magnetic field coils 15 and 16, and a 500 W microwave 14 was inputted. In this case, the sputter amount was controlled by adjusting the high-frequency power of 400 KHz applied to the holder 7. When the sputter amount is large, there is obtained an insulating film structure having almost no convex portion where the pattern line width was small as shown in FIG. 2. However, when the sputter amount is controlled, an insulating material is filled between the pattern lines, and a cross-sectionally triangular or trapezoidal convex portion having the same height as that formed where the lower pattern line width was large can be retained even where the pattern line width is small. As a result, when a film having flowability such as an SOG film is formed, the thickness of the film on the pattern can be rendered nearly uniform both where the lower pattern line width is small and where the lower pattern line width is large, since the above convex portion works as a retaining portion.

Figure 5A:
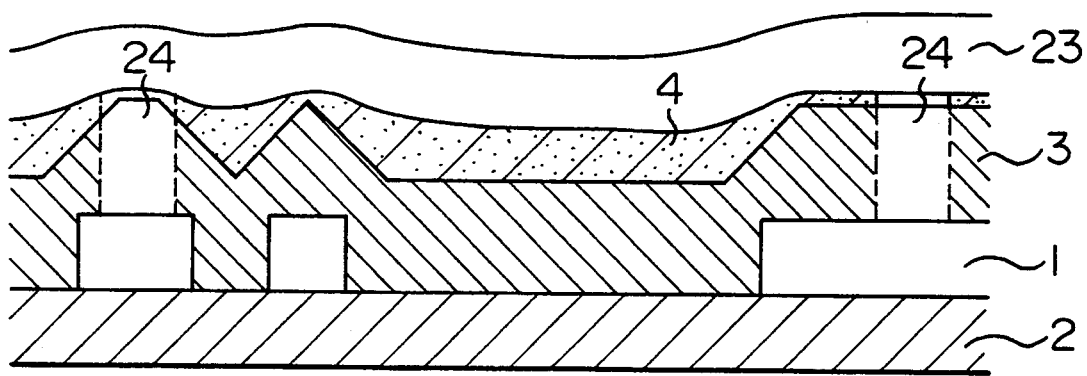
FIG. 5 shows one embodiment of the form of composite interlayer film according to the present invention.

FIG. 5A shows a cross-sectional view of a semiconductor substrate which was prepared as follows. An SOG film material containing an organic solvent was spin-coated on a substrate shown in FIG. 1, and the coating was densified by firing it to form a second silicon oxide layer or an $SiO_2$ film 4 as a second layer. then, through holes 24 were made where the lower Al pattern line width was large and where it was small by a reactive ion etching method using a $CHF_3$ gas, and after tungsten, W, which became an electrically conductive material, was formed in the through holes by a selective CVD method using $WF_6$ and $SiH_4$, an Al connection pattern 23 which became a second connection pattern was formed. The Al connection pattern as a second layer had a total length of 5 mm.

Figure 5B:
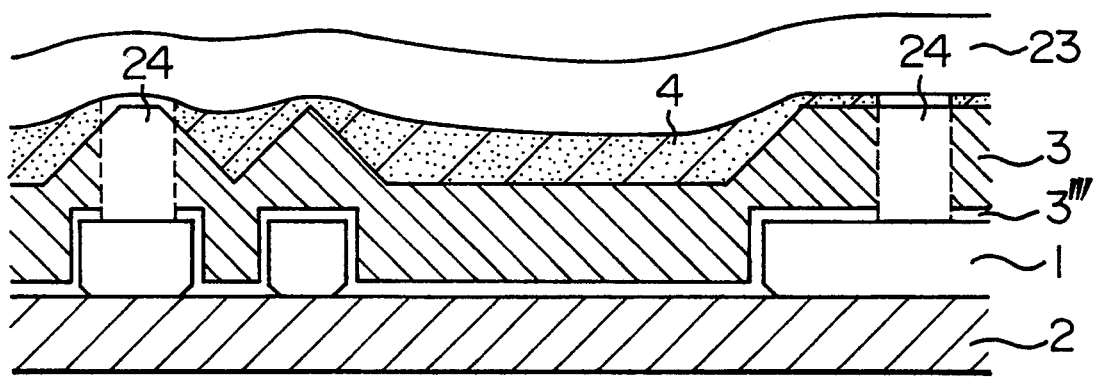
Figure 5C:
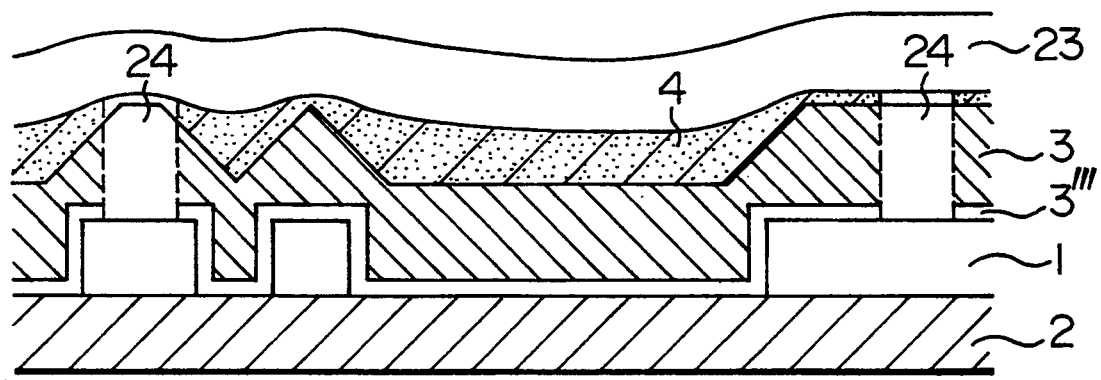

As shown in FIGS. 5B and 5C, a thin silicon oxide layer 3''' may be provided under the first silicon oxide layer 3. In this case, for example, the thin silicon oxide layer 0.15 μm in thickness is formed by introducing tetra ethoxy ortho silicate (TEOS) instead of $SiH_4$ into the treatment chamber 19 to 10 Pa. without applying high-frequency power. Thereafter, the first silicon oxide layer is formed using $SiH_4$ or TEOS, and $O_2$ in the same manner as in FIG. 4. As shown in FIG. 5B, the connection pattern has depressions formed by concentration of the electrical field during etching.

Figure 6:
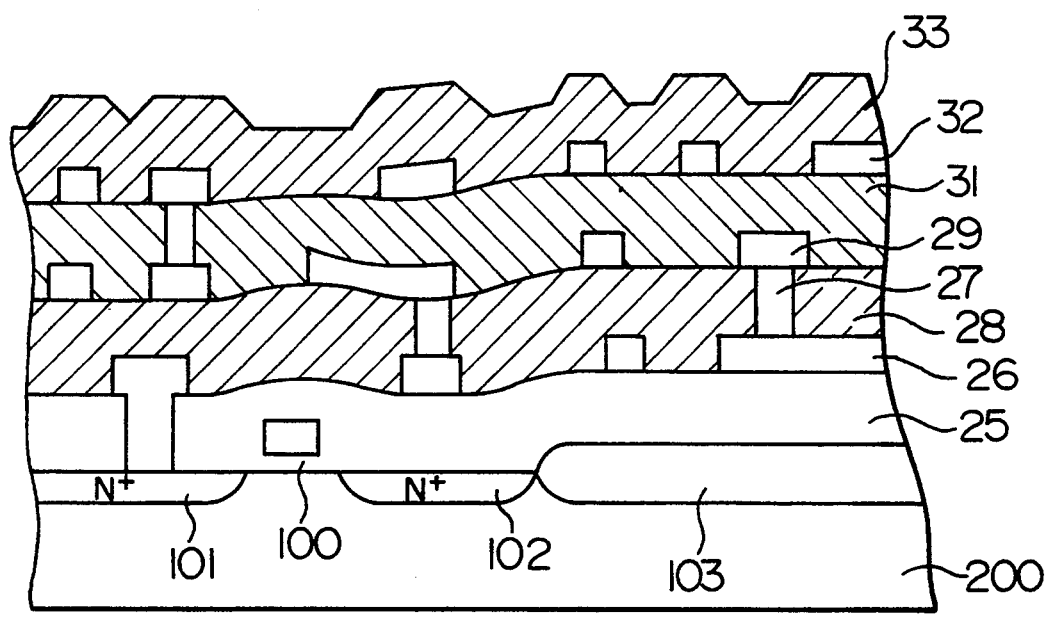
FIG. 6 is a cross-sectional view of a MOSIC device having an interlayer film and a protection film which have forms according to the present invention.

FIG. 6 shows a partial cross-sectional view of a semiconductor device being formed by means of two-layered insulating film formation and having three Al connection patterns on an MOS transistor.

In FIG. 6, numeral 25 indicates an insulating film produced of an $SiO_2$ film formed by a hot CVD method and an $SiO_2$ film formed by boron doping. Numerals 26, 29 and 32 indicate first, second and third Al materials, and numerals 28 and 31 indicate interlayer $SiO_2$ insulating films formed by the method described concerning FIG. 5. Numeral 33 indicates an SiN protection film having the structure shown in FIG. 1. Numeral 200 indicates a semiconductor substrate, 100 indicates an MOS transistor gate electrode, numeral 101 indicates a source region, numeral 102 indicates a drain region, and numeral 103 indicates a device-separating insulating film.

The present inventor has made a study on the influence which the difference between the film thickness $h_1$ where the lower electrically conductive material pattern line width, which becomes the first connection pattern shown in FIG. 1, is small and the film thickness $h_2$ where the same is large has on an Al pattern disconnection ratio by the use of the semi-conductor substrate shown in FIG. 5.

Figure 7:
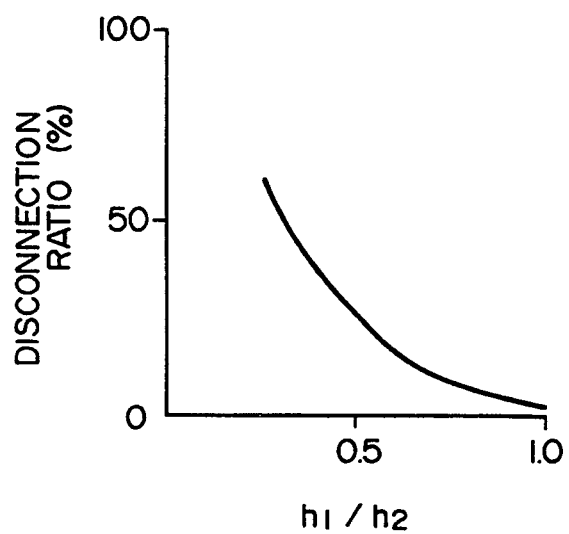
FIG. 7 shows the dependency of an Al pattern disconnection ratio on a through hole depth ratio.
Figure 8:
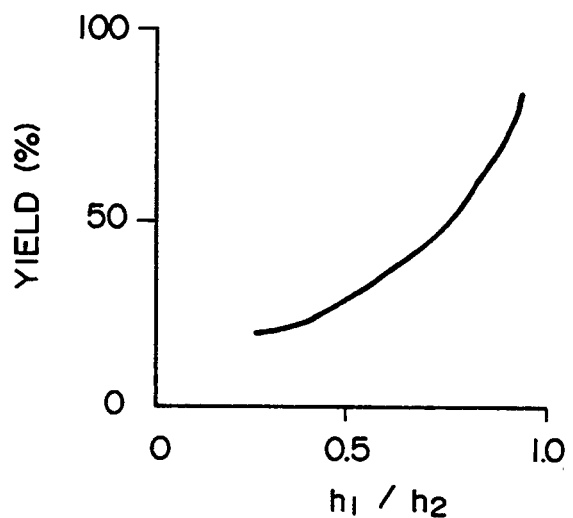
FIG. 8 shows the dependency of a yield on a through hole depth ratio.

The difference between $h_1$ and $h_2$ was caused by controlling the sputter amount. FIG. 7 shows the dependency of the disconnection ratio on the $SiO_2$ film thickness (through hole depth) ratio, $h_1/h_2$, after a PCT (pressure cooker test) for 1 day. When the $SiO_2$ film as a first layer had the form shown in FIG. 2, the $h_1/h_2$ ratio was 0.4. The test used 64 samples formed under the same conditions. As shown in FIG. 7, when the $h_1/h_2$ ratio is nearly 1, that is, when the through holes have a nearly equal depth, almost no disconnection occurs. However, when the $h_1/h_2$ ratio is 0.8 or less, the disconnection ratio greatly increases. When the $h_1/h_2$ ratio is about 0.4, that is, when a the first $SiO_2$ film is formed by a conventional CVD method combined no sputtering, the disconnection ratio exceeds 50%. A further study has been made on the influence of the through hole depth difference on the yield of the production of ICs having MOS transistors having multilayer interconnection. As a sample, there-layered Al pattern MOSICs shown in FIG. 6 formed by the two-layer interlayer $SiO_2$ film formation method described concerning FIG. 5. The number of the samples was 6,400 pieces. FIG. 8 shows the yield relative to the through hole depth ratio, $h_1/h_2$, above. FIG. 8 also shows the same result and the same dependency as those in FIG. 7, that is, where the $h_1/h_2$ ratio is low, the yield is very low, and where the $h_1/h_2$ ratio is nearly 1, the yield is high.

The above results show the following; The first layer is formed by a CVD method with controlling the sputter amount such that convex portions where the lower pattern lines are small have the same height as that where the lower pattern line is large, and a flattened film having high flowability is formed thereon as a second layer, whereby a uniform insulating film can be formed nearly on all the area of the pattern since the above convex portions works as a retaining portion. This uniform insulating film is used as an interlayer insulating film for multilayered patterns. Due to this, the depth of each through hole is nearly constant, the disconnection of the Al pattern can be reduced, and the yield of the production of semiconductor devices can be improved.

Figure 9:
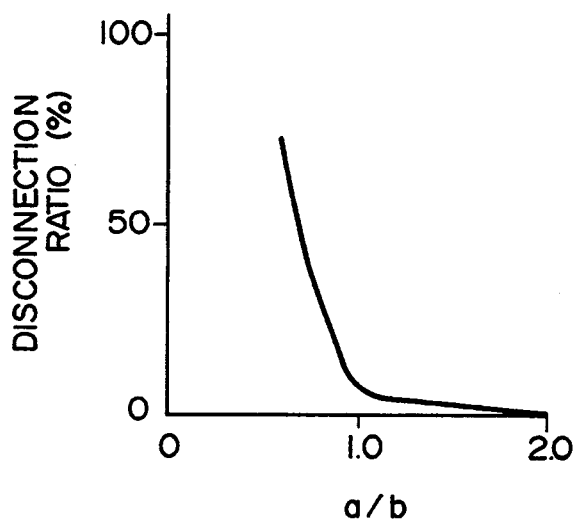
FIG. 9 shows the relationship between an Al pattern disconnection ratio and the ratio of the groove width on an $SiO_2$ film as a first layer to a pattern line distance.

The present inventor has prepared an $SiO_2$ film formed of two layers on the substrate shown in FIG. 5, and made a study on the influence of the groove width between the convex portions formed on the first $SiO_2$ layer correspondingly to the lower pattern on the reliability of a semiconductor device. When the $SiO_2$ film as a first layer is formed by a CVD method combined no sputtering, the groove width on the $SiO_2$ film is smaller than the distance between the lower pattern lines as shown in FIG. 3. On the other hand, when the first layer is formed by a CVD method with controlling the sputter amount, the groove is formed on the $SiO_2$ so as to have an angle of 45 degrees to the substrate surface, which result means that the groove width between the convex portions can be widened greater than the distance between the lower pattern lines. $SiO_2$ film as a first layer are formed by a CVD method in which the sputter amount is gradually increased, and then, an $SiO_2$ film as a second layer is formed from an SOG film containing an organic solvent. With substrates prepared as described above, the influence of the ratio between the width, b, between lower pattern lines and the groove width, a, in the first layer (see FIG. 1) has been studied. FIG. 9 shows the dependency of the disconnection ratio on the groove width ratio a/b when 64 pieces of two-layer pattern samples were subjected to PCT for 1 day. The ratio, a/b of about 2, nearly corresponds to the cross section of the first layer shown in FIG. 1, and the ratio, a/b of about 0.5, corresponds to the cross section shown in FIG. 3.

When a/b < 1.0, a void 5 has been observed in the $SiO_2$ as a second layer as shown in FIG. 3. As shown in FIG. 9, when a/b > 1, that is, when the groove width of the first layer is greater than the lower pattern groove width, the disconnection ratio can be remarkably decreased.

Figure 10:
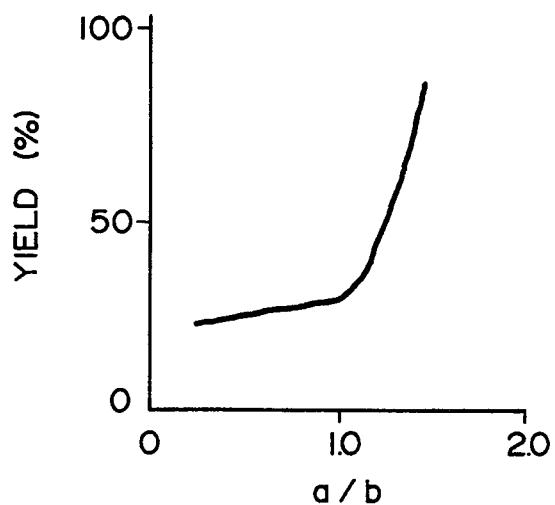
FIG. 10 shows the relationship between a MOSIC yield relative to the ratio of the groove width on an $SiO_2$ film as a first layer to a pattern line distance.

Further, the present inventor has prepared MOSICs and made a study on the yield when interlayer films having varied a/b ratios were used. FIG. 10 shows the result that when the groove width of the first layer of the interlayer is greater than the distance between the lower Al pattern lines, the yield is remarkably improved as in the improvement in the disconnection ratio. In samples having an a/b ratio < 1.0, a "void" was formed, and the pattern line portions adjacent to the void were corroded.

As described above, when the groove of the first layer of the $SiO_2$ as an interlayer film is widened greater than the distance between the lower pattern lines, for example, by means of CVD combined sputtering, the film having flowability as second layer is completely filled in the groove of the first layer. Therefore, the reliability of the connection pattern can be improved.

Figure 11:
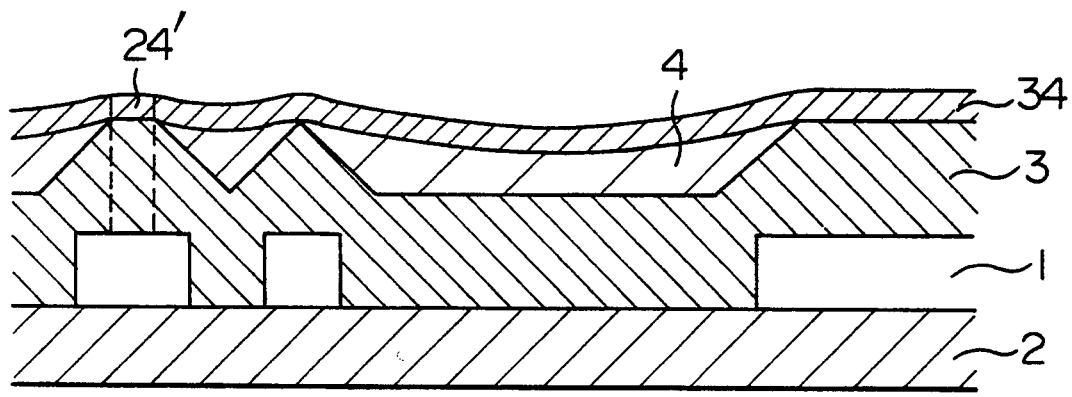
FIG. 11 is a cross-sectional view of an interlayer insulating film having a form according to the present invention.

In addition, degassing occurs in the SOG film. Therefore, the formed SOG film was subjected to etchback as shown in FIG. 11 so that the through hole portion was not in contact with the SOG film, and an $SiO_2$ as a third layer was formed by a plasma CVD method to form an interlayer film. When such interlayer films were used in a multi-layer connection pattern as an insulating film, the yield was further improved since the degassing of the SOG had no influence.

Further, the present inventor has prepared insulating films by forming $SiO_2$ films as a first layer and forming SOG films containing varied solvents as a second layer under the conditions of a/b=2.0 as shown above, and studied the influence of the surface form on an upper electrically conductive material layer.

Figure 12:
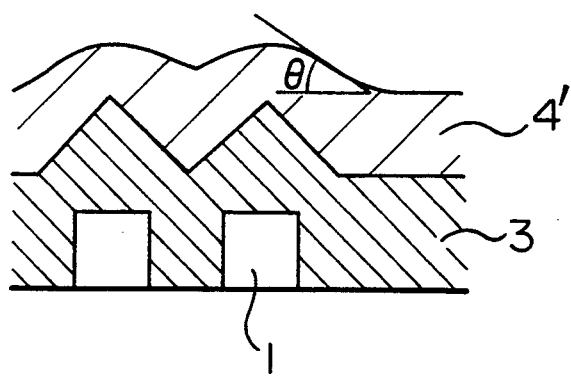
FIG. 12 is a cross sectional view of a device in which a second layer is formed.

The thickness of each SOG film was adjusted so as to be 0.40 μm where the lower electrically conductive material pattern interval was large. FIG. 12 shows the schematic cross-sectional view of the film of the two layers formed above. Numeral 3 indicates a first silicon oxide layer, and 4' indicates a second silicon oxide layer. In FIG. 12, $\theta$ refers to a maximum tangent angle of a surface formed at a point from an end of a large distance between the pattern lines to the beginning toward a pattern top.

Figure 13:
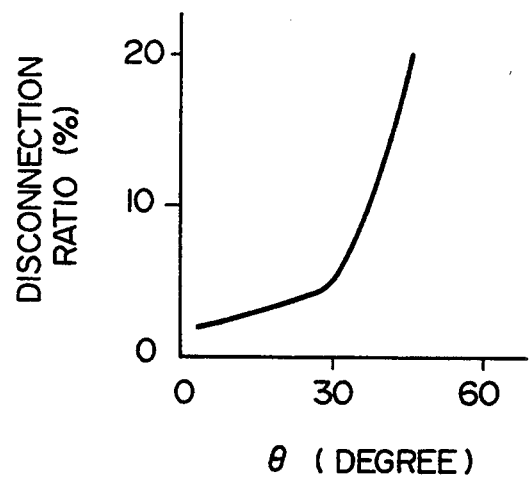
FIG. 13 shows the dependency of an Al disconnection ratio on the degree of inclination of a second layer surface.

64 Al connection patterns having a film thickness of 0.5 μm, a pattern width of 0.4 μm and a total length of 3 mm were formed on the same films as the above film of two layers and then, subjected to a pressure cooker test for 2 hours. FIG. 13 shows the disconnection ratio of the Al connection patterns relative to $\theta$. It is shown in FIG. 13 that with a decrease in $\theta$, i.e., with an increase in the smooth flatness of the surface form of the second layer, the disconnection ratio of the upper electrically conductive material pattern can be more decreased.

Figure 14:
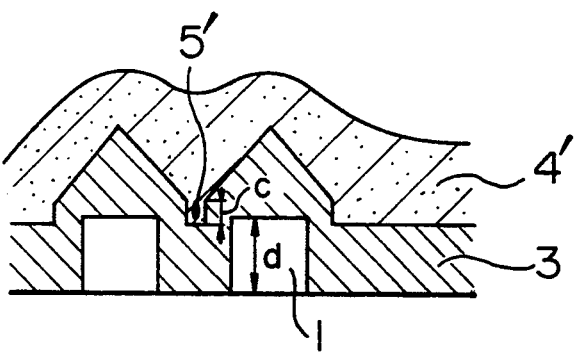
FIG. 14 is a cross-sectional view of a composite insulating film when the sputter amount is controlled.
Figure 15:
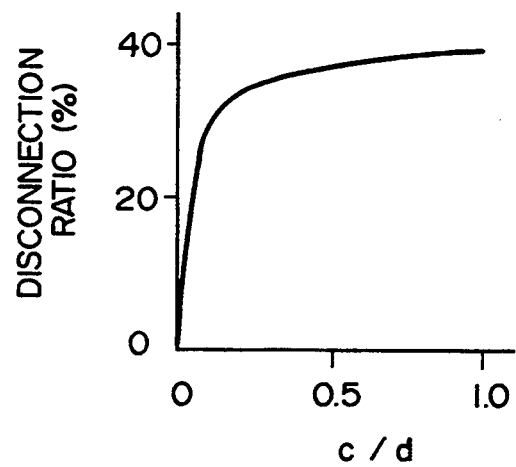
FIG. 15 shows the dependency of a disconnection ratio on the groove height of a first layer.

Further, the $SiO_2$ film as a first layer was formed by decreasing the sputter amount such that the $SiO_2$ film had a groove having a vertical wall in the perpendicular direction to the substrate surface, and the influence of the groove on the form of the second layer and the lower electrically conductive material was studied. FIG. 14 schematically shows the cross-sectional form of the second layer, in which numeral 3 indicates the first layer formed with a decreased sputter amount, and numeral 4' indicates an $SiO_2$ film as a second layer. The first layer formed without sputtering has the same form as that 3" shown in FIG. 3. In this case, where the distance between the lower pattern lines is small, a void 5' is observed. In FIG. 14, "c" indicates a depth of a groove having a wall formed in the perpendicular direction to the substrate surface. 64 Al connection patterns on which the second layer was formed as above were subjected to a high-temperature high-humidity test for 1 day, and FIG. 15 shows the disconnection ratio relative to the ratio of the pattern line height to the above depth of a groove. In FIG. 15, the first layer having a ratio c/d of nearly 1 corresponds to the cross section shown in FIG. 3. FIG. 13 shows the following. When the ratio of c/d nears zero very closely, that is, when the vertical groove formed of a wall in the perpendicular direction to the substrate surface is reduced, the disconnection of the lower pattern can be removed almost completely. In addition, when the ratio of c/d was 0.1 or more, a void was observed in the above vertical groove, and corrosion of the Al pattern was observed in the vicinity of the gap.

The above results show the following: It is important to moderate the inclination of the surface form of the interlayer insulating film between the electrically conductive pattern layers in order to decrease the disconnection ratio of the upper electrically conductive material. Even when the $SiO_2$ film was formed of a plurality of layers, it is important not to form any vertical groove having a wall in the perpendicular direction to the substrate surface in order to decrease the disconnection ratio of the lower electrically conductive material. Therefore, the interlayer insulating film as a first layer is formed so as not to have the above vertical groove but to have a degree of inclination to the substrate surface, and a film as a second layer or as some other layer is formed so as to have a moderate inclination, whereby the failure such as disconnection in the upper and lower connection patterns can be remarkably decreased.

Figure 16:
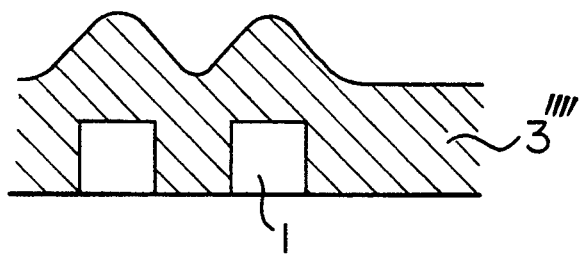
FIG. 16 cross-sectional view of an insulating film having a form according to the present invention.

The $SiO_2$ film as a first layer shown in FIG. 1 is lightly etched to moderate the inclination of the convex portions as shown in FIG. 16, the failure such as disconnection can be further decreased.

Figure 17:
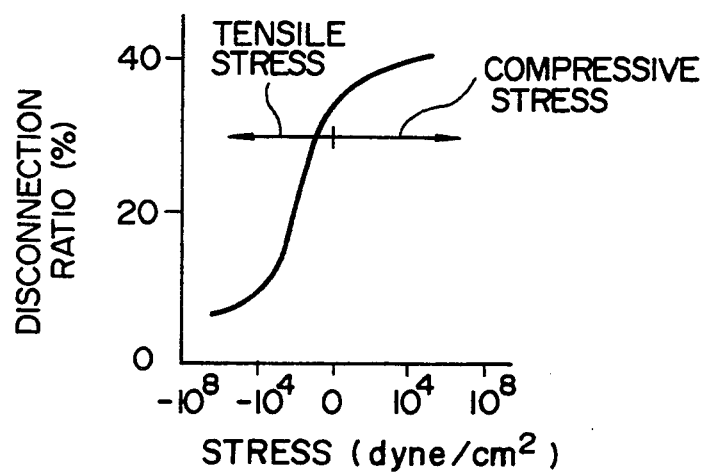
FIG. 17 showing the dependency of a disconnection ratio on the stress of a second layer of $SiO_2$ film.

Further, the present inventor has evaluated the reliability of the lower Al pattern on the stress of the composite film by using the same two-layer composite film as shown in FIG. 5. The second layers were formed from inorganic SOG, organic SOG, TEOS (tetraethoxysilane) and ozone, $O_3$, by a hot CVD method under various forming conditions such that the second layer had various stresses. In this case, the second layers were formed so as to have the same thickness and $\theta$ of about 30°. Thereafter, the stress dependency of the disconnection ratio on the stress of the second layer was examined by PCT evaluation. FIG. 17 shows the result that when the second layer has a tensile stress, the disconnection ratio can be decreased. This Figure shows the following; When the first layer has a compressive stress, the total stress is alleviated by forming the second layer so as to have a tensile stress. As a result, the failure can be decreased.

Figure 18:
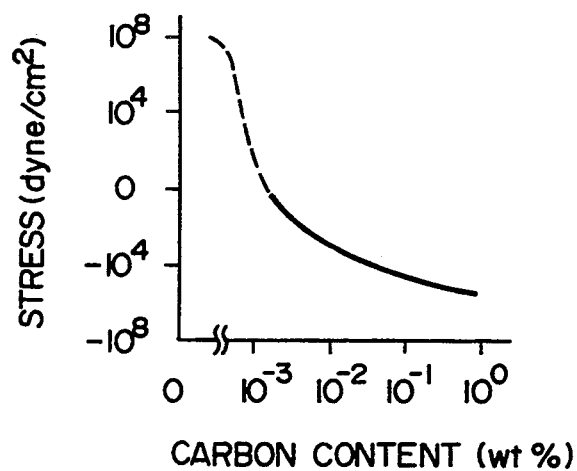
FIG. 18 shows the dependency of a stress on the C content in a film.

FIG. 18 shows the dependency of an $SiO_2$ film as a second layer on the carbon content in the film, in which the positive stress shows compression and the negative stress shows tension. This Figure shows that with an increase in the carbon content in the film, the stress alters toward a tensile stress. The above result shows that the use of a carbon-containing film as a second $SiO_2$ film is effective for decreasing the stress of the interlayer film as a whole on the lower electrically conductive material.

Figure 19:
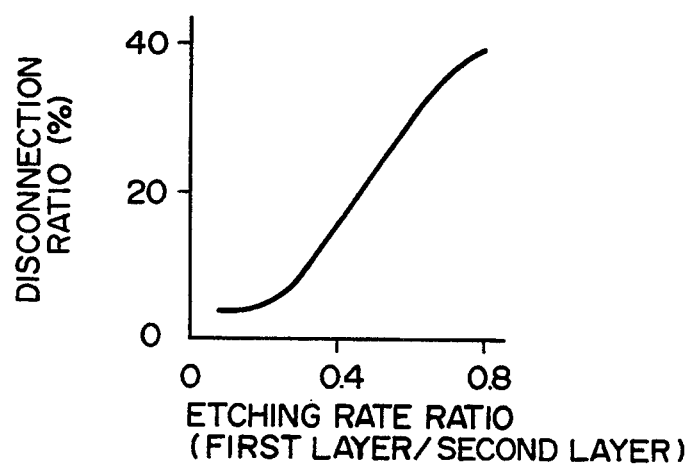
FIG. 19 shows the dependency of a disconnection ratio on the etching rate of a second layer.

FIG. 19 shows the result of the Al pattern disconnection ratio relative to the ratio of the etching rate of the second layer to the rate of etching the first $SiO_2$ film with a buffer hydrofluoric acid liquid. The $SiO_2$ films as a first layer were not altered, and the second films alone were altered. In general, as the etching rate increases, that is, as the density decreases, the stress decreases. FIG. 19 shows that the larger the etching rate of $SiO_2$ film as a second layer is, i.e., the lower the density of the $SiO_2$ film as a second layer is, the lower the disconnection ratio is. That is, when a film having a low density is used as a second layer, the stress of the composite film as a whole can be decreased, and as a result, the failure such as disconnection can be decreased.

Using the same substrate as that shown in FIG. 6, the present inventor has made a further study on the yield of samples, each of which was formed by changing the form of the SiN protection film indicated as 33 in FIG. 6 and covering it with a resin material. The SiN protection films were formed by means of the apparatus shown in FIG. 4 by introducing $N_2$ in the same amount in place of $O_2$. The other conditions were the same as those in the first embodiment.

Figure 20:
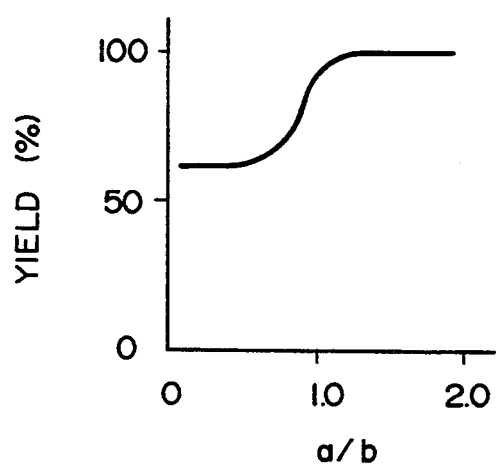
FIG. 20 shows the yield of MOSIC relative to the width of the convex portion and the height of the groove when an SiN protection film is formed.
Figure 21:
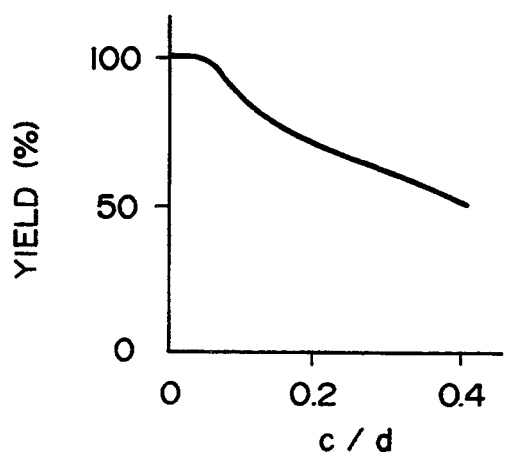
FIG. 21 shows the yield of MOSIC relative to the width of the convex portion and the height of the groove when an SiN protection film is formed.

FIG. 20 shows the yield of the production of MOS-ICs relative to the ration between the groove width, a, formed by the convex portions of the insulating film and the distance, b, between the lower electrically conductive material pattern lines (see FIG. 1), described in the first embodiment. FIG. 21 shows the yield relative to the height, c, of the wall of the insulating film in the perpendicular direction to the substrate surface, described in the second embodiment.

According to the present invention, the first layer of the interlayer insulating film for multilayer patterns is formed by a CVD method with controlling the sputter amount, and a second layer is formed of a film having flowability or giving a reflow form, whereby an interlayer insulating film having a uniform thickness can be obtained on every connection pattern. Since a CVD film formed by a CVD method superimposed with sputtering is very dense, there are effects that the leak current between pattern lines can be decreased, or the withstand voltage is improved and the humidity resistance is improved. The similar effects can be also obtained concerning the outermost protection film of the semiconductor device. Further, since the film is formed while the sputter amount is greatly reduced as compared with any conventional CVD method superimposed with sputtering, there is also an effect that the film-forming rate can be improved, and as a result, the throughput can be improved. Moreover, since the amount of dust generated by sputtering in an apparatus can be remarkably decreased, there is a further effect that the yield is improved.

The present invention provides a semiconductor device having substantially uniform interlayer insulating film(s) and a process for the production thereof.

The second aspect of the present invention will be described hereinafter by reference to drawings.

FIG. 22 shows a schematic view of a first embodiment of the microwave plasma treatment apparatus of the present invention.

In FIG. 22, numeral 301 indicates a substrate, 302 indicates a substrate holder, 303 and 304 indicate reaction gas feed lines, numeral 305 indicates a gas outlet, numeral 306 indicates a microwave supply port, numeral 307 indicates a microwave-introducing aperture, numeral 309 indicates a vacuum chamber, numeral 310 indicates a microwave guide tube, numeral 311 indicates a magnetic field supply coil, and 312 and 313 indicate gas feed ports. The same constituent members as those in a conventional apparatus shown in FIG. 24 are indicated by the same numerals.

In this embodiment, like the above conventional apparatus, the substrate 301 such as a substrate of silicon, etc., is arranged in the vacuum chamber in a state that it is placed on the substrate holder 302, and a gas to be fed from one reaction gas feed line, e.g., oxygen, $O_2$, is emitted, in the direction of an arrow, into the vacuum chamber 309 from one gas feed port 312 through a annular gas-introducing path (not shown). A gas to be fed from the other reaction gas feed line 304, e.g., a monosilane gas, $SiH_4$, is emitted, in the direction of an arrow, into the vacuum chamber 306 from the other gas feed port 313 through an annular gas-introducing path (not shown). Microwave is also supplied into the vacuum chamber 309 from the microwave supply port 306 through the wave guide tube 310 and the microwave-introducing aperture, and a magnetic field generated by the magnetic field supply coil 311 is supplied to the vacuum chamber 309. Reacted gases and an excess of the gases are discharged out of the vacuum chamber 309 through the gas outlet 305.

In particular, in this embodiment, the two gas feed ports 312 and 313 are positioned closely to each other, and these gas feed ports 312 and 313 are also positioned near to the substrate 301, that is, these gas feed ports are positioned within the corresponding $SiH_4$ molecule and oxygen, $O_2$ molecule average free path distances to the substrate 301.

The operation of the apparatus of this embodiment is, in principle, the same as that of the conventional apparatus shown in FIG. 34. In the vacuum chamber 309, the substrate 301 of silicon, etc., is placed on the substrate holder 302, an oxygen, $O_2$, gas and a monosilane, $SiH_4$, gas are emitted out of the gas feed ports 312 and 313, respectively. Further, microwave is supplied from the microwave supply port 306 through the microwave guide tube 310 and the microwave-introducing aperture, and a magnetic field having a desired strength is supplied into the vacuum chamber 309 by energizing the magnetic field supply coil 311, whereby a thin film of silicon dioxide, $SiO_2$, is formed on the substrate 301.

The present inventor has confirmed the function (function and effect) of the present as follows. That is, the conventional apparatus shown in FIG. 34 and the apparatus of this embodiment were used, and in the conventional apparatus, the distance from each of the gas feed ports 312 and 313 to the substrate was changed. And, the following various experiments were carried out to study on the dependency of the above two gas feed ports 312 and 313 on the distance (difference in density of the silicon dioxide, $SiO_2$, film when the distance was varied). The basic conditions for these experiments are as follows.

A silicone dioxide, $SiO_2$, film was formed on the substrate 301 of silicon from oxygen, $O_2$ as one gas and monosilane, $SiH_4$ as the other gas. An aluminum chamber having a maximum diameter of 500 mm was used as the vacuum chamber 309, and a disk-shaped substrate having a diameter of 100 mm was used as the substrate 301. As one gas, an oxygen, $O_2$, gas was introduced into the vacuum chamber 309 at a rate of 300 ml/minute, and as the other gas, a monosilane, $SiH_4$, gas was also introduced to the vacuum chamber 309 at a rate of 30 ml/minute. At the same time, the gas was exhausted to keep the pressure in the vacuum chamber 309 at 0.2 Pa. A magnetic field having at least 875 Gauss was charged from the magnetic field supply coil 311 onto the central axis of the apparatus, and microwave having a power of 3 kw was supplied from the microwave supply port 306.

Experimental Example 1

In the apparatus shown in FIG. 34, one gas feed port 312 to feed an oxygen, $O_2$, gas was fixed (the distance from the substrate 301 was taken as L), and the other gas feed port 313 to feed a monosilane, $SiO_4$, gas was positioned in a distance of 40 mm from the substrate 301. And, microwave and the electric field supply coil were adjusted such that an electron cyclotron resonance (ECR) surface was formed 30 mm far from the substrate 301, and these members were moved toward the central axis of the apparatus as shown in dotted lines in FIG. 34. In this movement, the relationship between the above distance, L, and the etching rate (density) of the silicon dioxide, $SiO_2$, film with a buffer hydrofluoric acid liquid ($HF:NH_4 = 1:6$, liquid temperature=25° C.) was examined to show the result shown in FIG. 27. Further, the relationship between the above distance, L, and the silicon/oxygen, Si/O$_2$, element ratio in the silicon dioxide, SiO$_2$, film was examined to show the result shown in FIG. 28.

According to FIG. 27, when the above distance, L, exceeds 150 mm, the etching rate increases (the density of the film is deteriorated). Further, when the above distance, L, exceeds 150 mm, the amount of silicon, Si, is in excess as compared with the stoichiometric composition ratio of silicon dioxide, SiO$_2$, film is coarse.

Meanwhile, the reason for having obtained the results shown in FIGS. 27 and 28 is considered as follows. When the pressure in the vacuum chamber 309 is 0.2 Pa, the average free path distance of oxygen, O$_2$, molecules is 150 mm, and that of monosilane, SiO$_4$, molecules is 50 mm. In the formation of the silicon dioxide, SiO$_2$, film, the distance from the substrate 301 to one gas feed port 312 was set within the average free path distance of oxygen, O$_2$, molecules, whereby the probability of oxygen, O$_2$ molecules and plasma-excited oxygen, O$_2$, molecules arriving at the substrate 301 without collision in the course from one gas feed port 312 to the substrate 301 increases. In other words, the gas reaction on the substrate 301 is a main reaction, and as a result a dense silicon dioxide, SiO$_2$, film having a composition equivalent to a stoichiometric composition ratio of silicon dioxide, SiO$_2$, can be formed.

Experimental Example 2

Experimental Example 1 was repeated except that the gas to be fed from one gas feed port 312 was changed from oxygen, O$_2$, to nitrogen, N$_2$. This Experimental Example also shows that when the distance, L, from the substrate 301 to the gas feed port 312 is set within the average free path distance of nitrogen, N$_2$, molecules, a dense silicon nitride, SiN$_2$, film having a composition equivalent to a stoichiometric composition ratio of silicon nitride, SiN$_2$, can be formed.

Experimental Example 3

In the apparatus of one embodiment of the present invention shown in FIG. 22, oxygen, O$_2$, was fed from one gas feed port 312, and monosilane, SiO$_2$, was fed from the other gas feed port 313, and the same experiment as that described in Experimental Example 1 was repeated to form silicon dioxide, SiO$_2$, films under the same conditions as Experimental Example 1. In this Experimental Example, the apparatus of the present invention was so constituted that the distance from the substrate 301 to one gas feed port 312 was set within the average free path distance of oxygen, O$_2$, molecules, specifically within a distance of 150 mm. Therefore, this Experimental Example has shown that a dense silicon dioxide, SiO$_2$, film having a composition equivalent to a stoichiometric composition ratio of silicon dioxide, SiO$_2$, is formed even with the apparatus of the present invention similarly to Experimental Example 1.

FIG. 23 is a schematic cross-sectional view of the second embodiment of the microwave plasma treatment apparatus of the present invention.

In FIG. 23, numeral 308 indicates a gas feed portion. Numeral 314 indicates an upper quartz plate. Numeral 315 indicates a lower quartz plate. Besides these, the same constituent members as those in the first embodiment are indicated by the same numerals.

FIG. 24 is a schematic cross-sectional view of the gas feed portion 308 in the second embodiment. FIG. 25A is a bottom view of the upper quartz plate, FIG. 25A is a cross-sectional view of the upper quartz plate, and FIG. 26 is a top view of the lower quartz plate.

In FIGS. 24 to 26, numeral 316 indicates a ring made of aluminum, numerals 317 and 318 indicate a plurality of grooves formed in the lower portion of the upper quartz plate 314, numerals 319 and 320 indicate holes provided in the end portions of the grooves 317 and 318, 321 and 322 indicate numerous holes provided in the lower quartz plate 315, and besides these, the same constituent members as those in the first embodiment are indicated by the same numerals.

The upper quartz plate 314 and the lower quartz plate 315 are arranged in the upper portion of the vacuum chamber 309 so as to face each other, and their marginal portions are held on and fixed to the wall of the vacuum chamber 309 with the ring 316 made of aluminum. A plurality of pair-constituting gas feed paths are formed of a plurality of pair-constituting grooves formed in the upper quartz plate 314 and the lower quartz plate 315, and numerous gas introduction ports indicated by numerals 321 and 322 are arranged in the lower quartz plate 315 along the gas feed paths. In the interior of the ring 316 made of aluminum, Al, one pair-constituting gas feed path communicates with one reaction gas feed line 303 through the hole 319, and the other pair-constituting gas feed path communicates with the other reaction gas feed line 304 through the hole 320. In addition, the upper and lower quartz plates 314 and 415 in this embodiment also has the function of the microwave-introducing aperture 307 of the first embodiment of the present invention, and the gas-emitting ports 321 and 322 correspond to the gas feed ports 312 and 313 of the first embodiment.

This embodiment has the following constitution. A gas to be supplied by one reaction gas feed line 303, e.g., oxygen, O$_2$, is introduced into one pair-constituting gas-introducing path through the hole 319, and then emitted toward the substrate 301 through numeral gas-emitting ports 321 formed in the gas feed path, and a gas to be supplied by the other reaction gas feed line 304, e.g., monosilane, SiH$_4$, is introduced into the other gas feed path through the hole 320, and then similarly emitted toward the substrate 301 through numerous gas-emitting ports 322 formed in this gas feed path.

In this embodiment, the following experiments were also carried out by the use of the conventional apparatus shown in FIG. 34 and the apparatus of this embodiment.

Experimental Example 4

With the conventional apparatus above, the same experiment as that in Experimental Example 1 was carried out under the same conditions as those in Experimental Example 1 to give the results shown in FIGS. 27 and 28.

Experimental Example 5

A silicon nitride film was formed in the same manner as in Experimental Example 4 except that the oxygen, O$_2$, was replaced with nitrogen, N$_2$. As a result, the same silicon nitride film as that in Experimental Example 2 was obtained.

Experimental Example 6

With the apparatus of the embodiment of the present invention, the same experiment as that in Experimental Example 4 was carried out under the same conditions as those in Experimental Example 4. This Experimental Example also shows that a dense silicon dioxide, $SiO_2$, film having a composition equivalent to a stoichiometric composition ratio of silicon dioxide, $SiO_2$, can be formed.

Further, the following experiments were carried out by the use of an apparatus of the first embodiment which had an annular gas feed path of which the gas-emitting ports (gas feed ports) were opened in parallel with the substrate 301 (this introduction means is referred to as "annular emission" hereinafter) and an apparatus of this embodiment having a plurality of gas feed paths in parallel with the substrate 301 of which the gas-emitting ports (gas feed ports) were opened in parallel with the substrate 301 (this introduction means is referred to as "plane emission" hereinafter). In the apparatus of this embodiment, the distance from the substrate 301 to the gas feed port 312 was set at 50 mm. In the apparatus of the first embodiment, the distance from the substrate 301 to the gas feed port 312 to feed an oxygen gas, $O_2$, was set at 60 mm, and the distance from the substrate 301 to the gas feed port 313 to feed a monosilane gas, $SiO_4$, was set at 50 mm.

Experimental Example 7

By forming silicon dioxide, $SiO_2$, films on disk-shaped substrates 301 by the use of the apparatus of the first embodiment having a means of annular emission and the apparatus of this embodiment having a means of plane emission, and the relationship between the distance, R, from the center of the substrate 301 in radial direction and the deposition rate of each of the above films were studied to show the characteristics shown in FIG. 29.

FIG. 29 clearly shows that the deposition rate of a silicon dioxide, $SiO_2$, film is considerably higher when the apparatus of this embodiment is used than when the apparatus of the first embodiment is used.

Experimental Example 8

By similarly forming silicon dioxide, $SiO_2$, films on disk-shaped substrates 301 by the use of the apparatus of the first embodiment having a means of annular emission and the apparatus of this embodiment having a means of plane emission, and the relationship between the distance, R, from the center of the substrate 301 in radial direction and the elemental composition ratio of silicon, Si, and oxygen, $O_2$ were studied to show the characteristics shown in FIG. 30.

FIG. 30 clearly shows that the elemental composition ratio of silicon, Si, and oxygen, $O_2$, is rendered uneven when the distance, R, increases in the apparatus of the first embodiment, while the above elemental composition ratio is constant without regard to the above distance, R, in the apparatus of this embodiment.

Experimental Example 9

By similarly forming silicon dioxide, $SiO_2$, films on disk-shaped substrates 301 by the use of the apparatus of the first embodiment having a means of annular emission and the apparatus of this embodiment having a means of plane emission, and the relationship between the distance, R, from the center of the substrate 301 in radial direction and the etching rate of the silicon dioxide, $SiO_2$, film (density of the film) were studied to show the characteristics shown in FIG. 31.

FIG. 31 clearly shows that the etching rate of the above silicon dioxide, $SiO_2$, film (density of the film) varies depending upon the above distance, R, in the apparatus of the first embodiment, while the etching rate is constant in the apparatus of this embodiment without regard to the above distance, R.

Further, FIG. 32 is a schematic cross-sectional view of a microwave plasma treatment apparatus of a third embodiment of the present invention.

In FIG. 32, numeral 323 indicates a microwave resonance portion, numeral 324 indicates a quartz aperture, numeral 325 indicates a microwave-introducing aperture, and the same constituent members as those in the above embodiments are indicated by the same numerals.

Figure 33A:
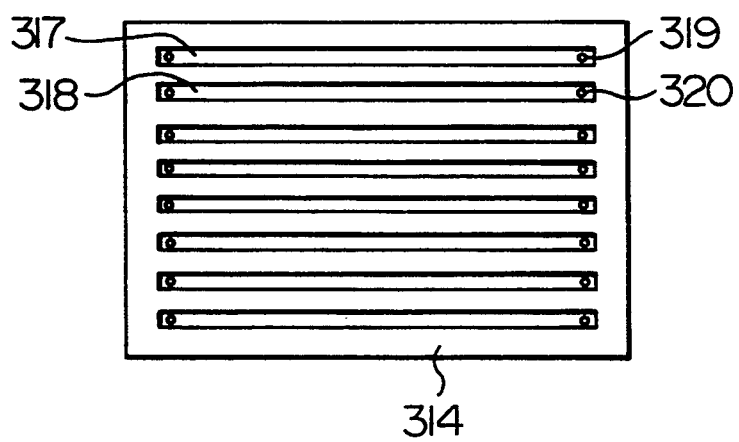
Figure 33B:
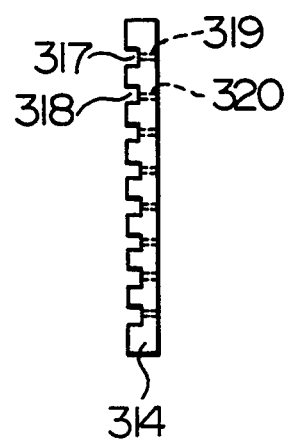

The apparatus of this embodiment has the same constitution as that of the second embodiment except for the following. The microwave resonance portion 323 is formed between the top portion of the vacuum chamber 309 and the microwave guide tube 310. Microwave is first introduced into the microwave resonance portion 323 through the quartz aperture 324, and then introduced into the vacuum chamber 309 through the microwave-introducing aperture 325. The substrate holder 302 is movable in the direction of the central axis of the apparatus. As shown in FIG. 33A for the bottom view of the quartz plate and in FIG. 33B for the cross-sectional view of the quartz plate, the upper quartz plate 414 and the lower quartz plate 315 are rectangular.

The following experiments were also carried out with the apparatus of this embodiment.

Experimental Example 10

The pressure in the vacuum chamber 309 was set at 0.4 Pa so that the average free path distance of oxygen, $O_2$, was 75 mm and that of monosilane, $SiO_4$, was 25 mm. The distance from the substrate 301 to one gas feed port 312 was set within 75 mm, and the distance from the substrate 301 to the other gas feed port 313 was set within 25 mm. The other conditions were the same as those in Experimental Example 6. Under these conditions, a silicon dioxide, $SiO_2$, film was formed to show that a dense and uniform silicon dioxide, $SiO_2$, film having a composition equivalent to a stoichiometric composition ratio of silicon dioxide, $SiO_2$, can be formed.

Experimental Example 11

The apparatus of the third embodiment shown in FIG. 32 was remodeled so that its cross-sectional form as a whole was rectangular with regard to the central axis of the apparatus, and to meet with this remodeling, the quartz plate 314 having a rectangular gas feed path and the substrate 301 having a rectangular form were used. The other conditions were the same as those in Experimental Example 6. Under these conditions, the same experiment as that in Experimental Example 6 was carried out to show that a dense and uniform silicon dioxide, $SiO_2$, film or silicon nitride, $SiN_2$ film can be formed on the substrate.

The above examples has dealt with the formation of a film on the substrate 301, while the microwave plasma treatment apparatus of the present invention also produces the following functions (functions and effects) when the etching is carried out. The functions have been confirmed in the following experiments.

Experimental Example 12

First, in the apparatus of the second embodiment, 300 ml/minute of sulfur fluoride, $SF_6$, was introduced from one reaction gas feed line 303, and 50 ml/minute of carbon tetrachloride, $CCL_4$, was introduced from the other reaction gas feed line 304 to carry out etching on a resist-patterned silicon, Si, substrate 301 having a diameter of 200 mm. Secondly, in the same apparatus, the same gases as above were introduced at the same rates from one reaction gas feed line after these gases were mixed just before the introduction thereof to carry out etching on a resist-patterned silicon, Si, substrate 301 having a diameter of 200 mm. In comparison of the results of the above experiments, the former case showed that the variabilities caused by dimensional shift of the substrate 301 was 0.05 mm at maximum and 0.01 at minimum, while the latter case showed that the variabilities caused by dimensional shift of the substrate 301 was 0.23 mm at maximum and 0.01 mm at minimum. Therefore, the former case showed a smaller variability than the latter case.

Experimental Example 13

The same etching treatment as that in Experimental Example 12 was carried out with the conventional apparatus shown in FIG. 34 under the same conditions as those in Experimental Example 12. As a result, the maximum variability was 0.5 mm.

The above Experimental Examples 12 and 13 have showed that the plasma treatment in the etching can be carried out more efficiently by separately feeding gases into the vacuum chamber 309 than by feeding a mixture of gases, and that the plasma treatment in the etching can be carried out more efficiently by the use of the apparatus of the second and third embodiments having a means of plane emission than by the use of the apparatus of the first embodiment having a means of annular emission.

In the apparatus of the second and third embodiments, the gas feed path is constituted of the upper quartz plate 314 having a plurality of grooves indicated by numerals 317 and 318 and the lower quartz plate 315 having numerous gas-emitting ports indicated by numerals 321 and 322 for plane emission of gases. However, the device for plane emission of gases shall not be limited to the above constitution, and any other constitution may be employed.

For example, the gas feed path may be constituted of a plurality of small quartz tubes arranged in parallel on one plane, and these quartz tubes may be provided with numerous gas feed ports on their surfaces toward the substrate.

A silicon dioxide, SiO₂, film was formed under the same conditions as those in Experimental Example 6 with a plane emission device having the above constitution while gases were separately fed to the quartz tubes, thereby to give the same result as that obtained in Experimental Example 6.

As specified above, the present invention has the constitution in which the gas feed ports 312 and 313 are positioned within the average free path distances of corresponding gases. Therefore, the present invention produces the effects that high-quality films and high-quality etched products can be formed and that the plasma treatment characteristics can be improved.

Further, in addition to the above constitution, the present invention has a constitution in which the gas feed ports 312 and 313 are opened in the perpendicular direction with regard to the substrate surface. Therefore, the present invention also produces the effects that high-quality films and high-quality etched products can be obtained and that the uniformity of the products can be obtained.

In the first plasma treatment apparatus of the present invention, the distance from the substrate to the gas feed ports 312 and 313 is set within the average free path distance of each gas, whereby an unnecessary gas reaction can be prevented as much as possible, and the gas reaction is limited to a necessary one. Therefore, a high-quality thin film can be formed or a high-quality etching treatment can be carried out by plasma treatment, and this formation or treatment can be also carried out at a high rate.

In the second plasma treatment apparatus of the present invention, the distance from the substrate to the gas feed ports 312 and 313 is set within the average free path distance of each gas, and that the gas feed ports 312 and 313 are opened in the perpendicular direction with regard to the substrate 301. Further, these gas feed ports 312 and 313 are arranged in the same distance from the substrate 301. Therefore, the flight distance of each gas in the vacuum chamber 309 is equal, an unnecessary gas reaction can be prevented as much as possible, and a necessary gas reaction can be promoted, whereby a high-quality thin film can be formed or a high-quality etching treatment can be carried out by plasma treatment, and this formation or treatment can be also carried out at a high rate. As a whole, the throughput can be remarkably improved.

Moreover, according to the above two embodiments, the distance from the substrate 301 to the gas feed ports 312 and 313 can be made smaller than that of any conventional apparatus of this type. Therefore, the length of the microwave plasma treatment apparatus in the central axis direction can be decreased, and a useless space in the vacuum chamber 309 can be decreased.

What is claimed is:

1. A semiconductor device comprising a semiconductor substrate, first metal connection layers provided on the semiconductor substrate through an insulating layer, a first silicon oxide layer provided on the first metal connection layer and the insulating layer, and a second connection layer provided on the first silicon oxide layer, wherein portions of the first silicon oxide layer provided on the insulating layer have greater thicknesses than the first metal connection layers, and portions of the first silicon layer provided on the first metal connection layers have thicknesses substantially the same as one another, and wherein the width of a groove of the first silicon oxide layer formed in lines of the first metal connection layers is larger than the width of a groove between the lines of the first metal connection layers.

2. A semiconductor device comprising a semiconductor substrate, first metal connection layers provided on the semiconductor substrate through an insulating layer, a first silicon oxide layer provided on the first metal connection layer and the insulating layer, and a second connection layer provided on the first silicon oxide layer, wherein portions of the first silicon oxide layer provided on the insulating layer have greater thicknesses than the first metal connection layers, and portions of the first silicon layer provided on the first metal connection layers have thicknesses substantially the same as one another, and wherein the width of a groove of the first silicon oxide layer formed in lines of the first metal connection layers is larger than the width of a groove between the lines of the first metal connection layers, wherein a surface forming the convex portion of the first silicon oxide layer has an angle of 45° to a surface of the substrate.

3. A semiconductor device according to claim 1 or 2, wherein a second silicon oxide layer which is different from the first silicon oxide layers in properties is formed between the first silicon oxide layer and the second connection pattern layer.

4. A semiconductor device according to claim 1 or 2, wherein the first silicon oxide layer is provided indirectly on the first metal connection layers and the insulating layer through a thin silicon oxide layer.

5. A semiconductor device according to claim 1 or 2, wherein a side wall surface forming the convex portion of the first silicon oxide layer has a smaller angle to a surface of the substrate than a side surface of the first connection pattern has to the surface of the substrate.

6. A semiconductor device according to claim 3, wherein an upper surface of the second silicon oxide layer is constituted of a moderately curved surface and an angle formed by a tangential line of a curved line on the upper surface and a surface of the substrate is not more than 30° at most.

7. A semiconductor device according to claim 3, wherein an etching rate of the first silicon oxide layer with a hydrofluoric acid solution is not more than ½ of an etching rate of the second silicon oxide layer.

8. A semiconductor device according to claim 3, wherein the first silicon oxide layer has a compression stress and the second silicon oxide layer has a tensile stress.

9. A semiconductor device according to claim 3, wherein the second silicon oxide layer contains carbon.

10. A semiconductor device according to claim 1 or 2, wherein an outermost protection film having a surface having an angle of about 45° to a surface of the substrate constituting the device is provided.

11. A semiconductor device according to claim 10, wherein a groove having a surface in a perpendicular direction to a surface of the substrate forming the device is not present.

* * * * *